United States Patent [19]
Saishouji et al.

[11] Patent Number: 5,968,260
[45] Date of Patent: Oct. 19, 1999

[54] METHOD FOR FABRICATING A SINGLE-CRYSTAL SEMICONDUCTOR

[75] Inventors: Toshiaki Saishouji; Tetsuhiro Iida; Kouzou Nakamura; Toshimichi Kubota; Junsuke Tomioka, all of Hiratsuka, Japan

[73] Assignee: Komatsu Electronic Metals Co., Ltd., Kanagawa, Japan

[21] Appl. No.: 08/829,412

[22] Filed: Mar. 31, 1997

[30] Foreign Application Priority Data

May 22, 1996 [JP] Japan ................................. 8-150288

[51] Int. Cl.$^6$ .................................................. C30B 15/20
[52] U.S. Cl. ................................. 117/13; 117/14; 117/15
[58] Field of Search ............................. 117/13, 14, 15

[56] References Cited

U.S. PATENT DOCUMENTS

| | | | |
|---|---|---|---|
| 5,474,020 | 12/1995 | Bell et al. ................................. | 117/20 |
| 5,487,355 | 1/1996 | Chiou et al. ............................... | 117/15 |
| 5,628,823 | 5/1997 | Chandrasekhar et al. ................. | 117/15 |

*Primary Examiner*—Felisa Hiteshew
*Attorney, Agent, or Firm*—Welsh & Katz, Ltd.

[57] ABSTRACT

A method for fabricating a single-crystal semiconductor by means of CZ method is disclosed. The method separates the single-crystal semiconductor from the melt by increasing the lift rate when the growth of a crystal body is finished. By controlling the lift rate, the single-crystal semiconductor is then gradually cooled within a range of an arbitrary crystal temperature, thereby forming a concave separated surface. The single-crystal semiconductor is cooled at a rate of lower than 35° C./min when the temperature of the separated surface is within a range between the melting point and 1000° C., or by keeping the temperature of the separated surface within a range between 1250° C. and 1000° C. for more than 30 minutes. Therefore, no dislocation is introduced in the crystal body, and productivity is improved.

4 Claims, 4 Drawing Sheets

METHOD FOR FABRICATING A SINGLE-CRYSTAL SEMICONDUCTOR

BACKGROUND OF THE INVENTION

1. Field of the Invention

The present invention relates to a method for fabricating a single-crystal semiconductor.

2. Description of Related Art

Semiconductor devices are generally formed on a high-purity single-crystal silicon wafer which is, in general, fabricated by Czochralski (CZ) method. The CZ method charges polysilicon blocks in a crucible inside a single-crystal fabricating apparatus and melts the blocks by heaters around the crucible. A seed which is held by a seed holder is then immersed in the melt and lifted with rotating in clockwise or counter-clockwise direction to grow the single-crystal silicon.

The process for fabricating the single-crystal semiconductor by means of the CZ method includes four steps as follows.

1. Necking step: a slender crystal region is grown to prevent the propagation of dislocations of seed crystal.

2. Crown step: a crystal region without dislocation is grown with its diameter gradually expanded to a predetermined dimension.

3. Body step: a crystal body having a diameter of the predetermined dimension is grown.

4. Tail step: in order to prevent the propagation of dislocation in the crystal body due to inconsistent thermal processes, a crystal region having a diameter which is gradually decreased is grown, thereby separating the crystal region from the melt.

The tail step requires about 10% of the total cycle time. Since the tail region cannot be utilized as a product, the time required in the tail step should be as short as possible. However, since the tail step is provided for eliminating the dislocation, it cannot be omitted. Therefore, the tail step is critical to the reduction of the cycle time for fabricating the single-crystal semiconductor.

SUMMARY OF THE INVENTION

Accordingly, the present invention provides a method for fabricating a single-crystal semiconductor in which no dislocation propagate in the crystal body even though the tail step is omitted.

The method of the invention fabricates a single-crystal semiconductor rod by means of CZ method. The method is characterized in that when the growth of the rod is finished, the rod is immediately separated from a melt, and the rod is cooled gradually by controlling a lifting rate, thereby forming a concave or concave-convex shaped on separated surface.

In the aforementioned method, the rod separated from the melt is cooled within a range from a melt temperature to the room temperature and the rod is cooled gradually in the range of arbitrary crystal temperature, thereby preventing the dislocations extended from the separated surface.

In a first method to cool the rod in the range of arbitrary crystal temperature, the separated rod is cooled at a rate of lower than 35° C./min when the separated surface is within a temperature range between the melting point and 1000° C.

In a second method to cool the rod in the range of arbitrary crystal temperature, the separated rod is kept for more than 30 minutes within a temperature range between 1250° C. and 1000° C.

The invention provides a method for fabricating the single-crystal semiconductor without the tail step. That is, the lift rate is accelerated to separate the single-crystal from the melt after finishing the growth of the body. Then the lift rate is slowed down to cool the as-grown single-crystal semiconductor. Therefore, the propagation of the dislocation in to body can be prevented even though no tail step is carried out. The single-crystal rod having a concave or concave-convex shaped on separated surface is then fabricated.

The single-crystal rod can be cooled to the room temperature and then removed to the exterior of the furnace when it has been gradually cooled in a range of arbitrary crystal temperature, i.e., the lower end of the body near the separated surface, to prevent the propagation of dislocation which is caused by inconsistent thermal processes.

A first cooling method cools the separated rod at a rate of lower than 35° C./min when the temperature of the separated surface is between the melting point and 1000° C., thereby preventing the propagation of the dislocations.

A second cooling method cools by keeping the separated rod a predetermined distance from the melt surface and the temperature of the separated surface is between 1250° C. and 1000° C. for more than 30 minutes, thereby preventing the propagation of the dislocations.

DETAILED DESCRIPTION OF THE INVENTION

Figure 1:
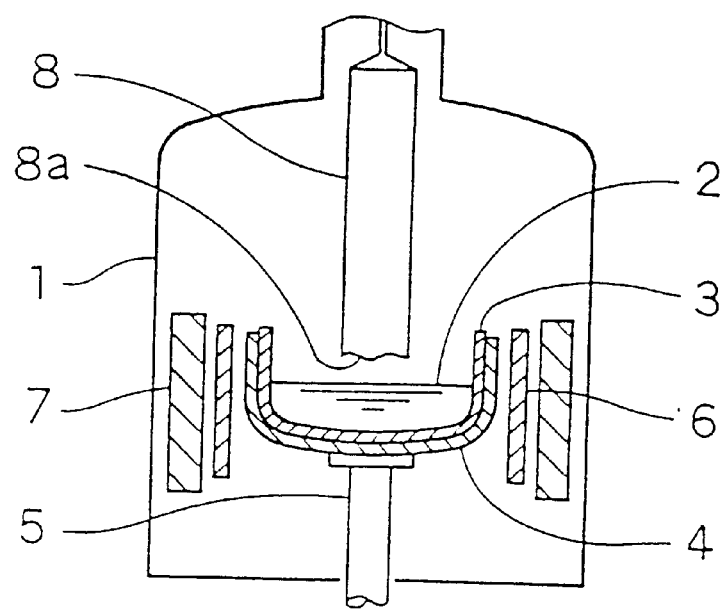
FIG. 1 is a schematic diagram of the apparatus for fabricating a single-crystal semiconductor, wherein the single-crystal semiconductor has been separated from the melt and has a predetermined distance from the melt surface.

The method for fabricating a single-crystal semiconductor according to the embodiment of the invention will be described in accompaniment with the drawings. Referring to FIG. 1, the apparatus for fabricating a single-crystal semiconductor by means of the CZ method includes a main chamber 1, in which are provided with a quartz crucible 3 for charging polysilicon melt 2 as polysilicon material, and a graphite crucible 4 for supporting the quartz crucible 3. The graphite crucible is capable of rotation and elevation on a crucible spindle 5. The apparatus further includes a ring heater 6 and an adiabtic cylinder 7 around the graphite crucible 4.

When the necking step and crown step are terminated, the body step is carried out to form a single-crystal semiconductor 8. When the single-crystal semiconductor has a predetermined length, the lift rate is increased to over 500 mm/min, thereby separating the single-crystal semiconductor 8 from the melt 2, as shown in FIG. 1. The separated surface 8a of the single-crystal semiconductor 8 is concave-shaped. When the single-crystal semiconductor 8 is separated from the melt 2 and has a distance of smaller than 9–22 cm to the melt surface(i.e., in a range where a temperature of the single-crystal 8 semiconductor before separation is about 1250–1000° C.), the single-crystal semiconductor is lifted at a rate of higher than 500 mm/min for preventing the introduction of dislocations. When the single-crystal semiconductor 8 reaches the aforementioned position, it is then either lifted at a rate of about 5 mm/min for more than 30 minutes or retained still there for more 30 minutes and then rapidly cooled to the room temperature. That is, the heater 6 is forced to operate for at least 30 minutes after the separation of the single-crystal semiconductor 8 from the melt 2, in both cases.

Figure 2:
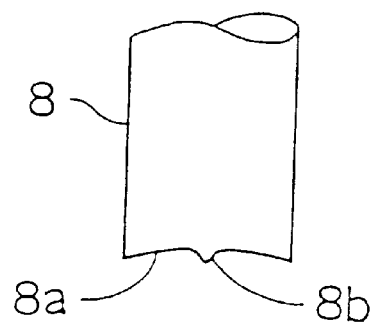
FIG. 2 illustrates an end shape of the single-crystal semiconductor which has been separated from the melt.

FIG. 2 illustrates the shape of the separated surface 8a. The separated surface 8a is concave-shaped and has a drop of melt crystallized in the center of the surface, thereby forming a peak 8b.

According to the aforementioned method, eleven examples from example A to K, in which the position of the separated single-crystal semiconductor and the cooling method are varied, are carried out. The single-crystal semiconductor fabricated in example A through example F is 4-inch Phospho-doped n-type semiconductor, whereas that fabricated in example G through example K is boron-doped p-type semiconductor. The outcomes of the examples are illustrated in Table 1. Moreover, the relationships between the temperature variation of the separated surface and its distance to the melt surface in the example G through example K are illustrated in FIG. 3 through FIG. 7, respectively. In the figures, the solid lines represent the temperature variation, while the dashed lines stand for the variation of the distance between the melt surface and the separated surface.

The cooling method utilized in the example A will be described. When the single-crystal semiconductor is separated from the melt, a first cooling step is carried out. That is, the single-crystal semiconductor is lifted at a rate of higher than 500 mm/min to where there is a distance of about 10 cm from the melt surface. Then a second cooling step is carried out. In this step, the lift rate is reduced to about 5 mm/min. Therefore, the single-crystal semiconductor is gradually lifted and cooled for about 30 minutes. The distance between the separated surface and the melt surface is about 25 cm when the second cooling step is finished. The example B and example D through example F utilize a cooling method the same as that of the example A. The outcomes show that there is no dislocation in the single-crystal semiconductor of the example A, example B, and example D through example F.

Figure 3:
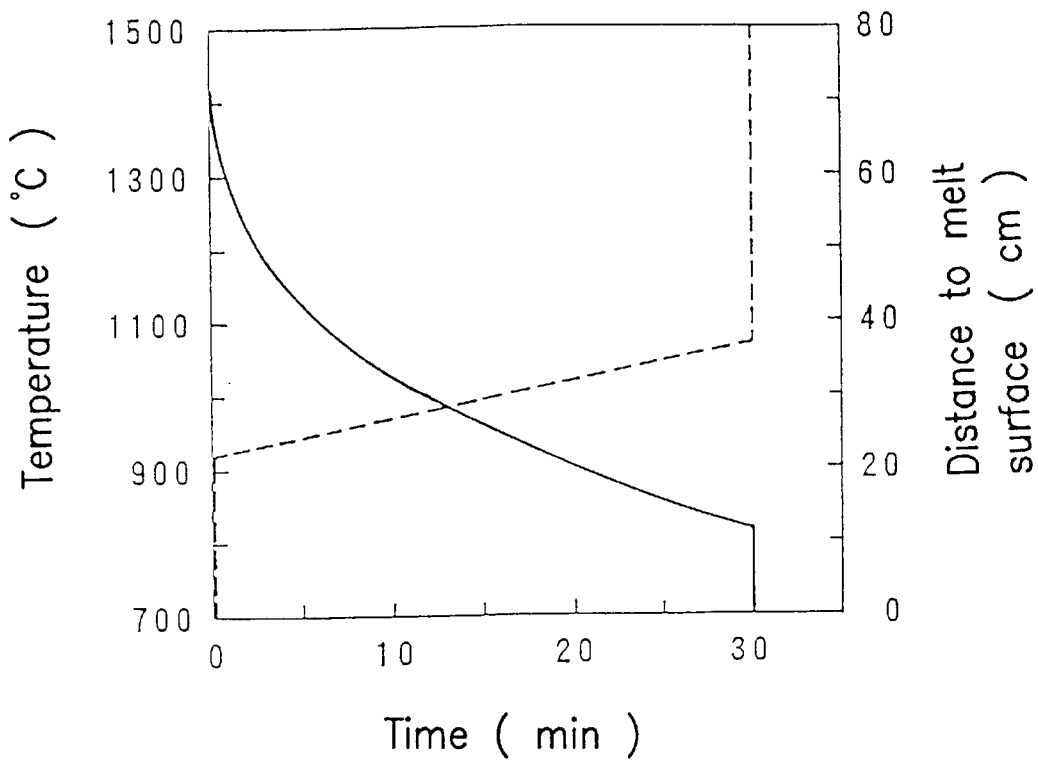
FIG. 3 illustrates the relationship between the temperature variation of the separated surface and its distance from the melt surface according to example G of the invention.

The example G through example K fabricate 6-inch p-type single-crystal semiconductor. Referring to FIG. 3, a first cooling step of the example G lifts the single-crystal semiconductor at a rate of higher than 500 mm/min to where there is a distance of about 22 cm from the melt surface. A second cooling step is similar to that of the example A. That is, the lift rate is reduced to about 5 mm/min, and the single-crystal semiconductor is gradually lifted and cooled for about 30 minutes. The distance between the separated surface and the melt surface is about 37 cm when the second cooling step is finished. Therefore, the cooling rate of the separated surface has an average value of smaller than 35° C./min when the temperature thereof is reduced from the melting point to 1000° C. The outcomes show that there is no dislocation.

Figure 4:
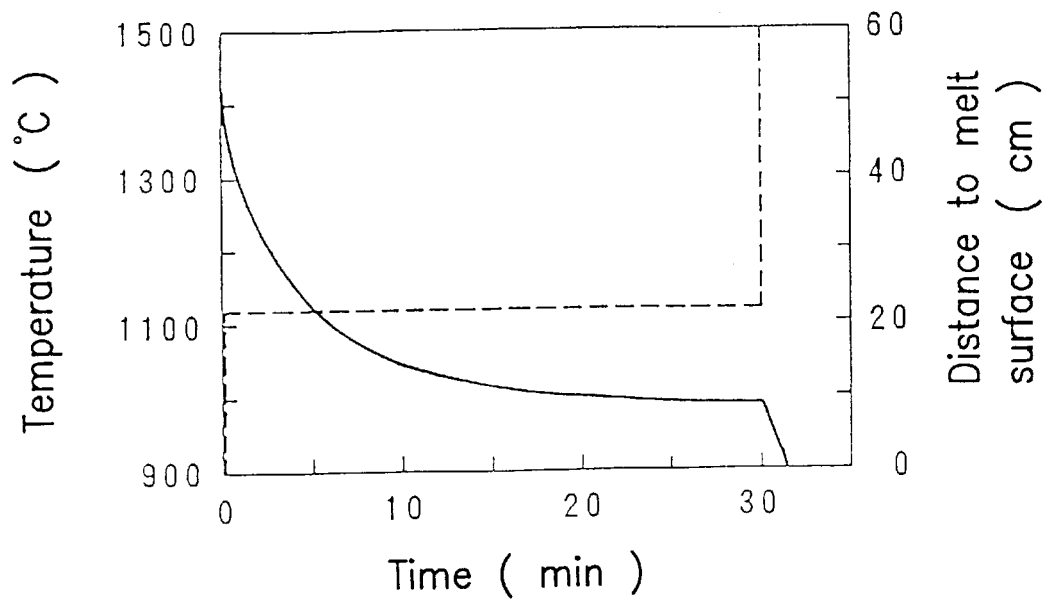
FIG. 4 illustrates the relationship between the temperature variation of the separated surface and its distance from the melt surface according to example H of the invention.
Figure 5:
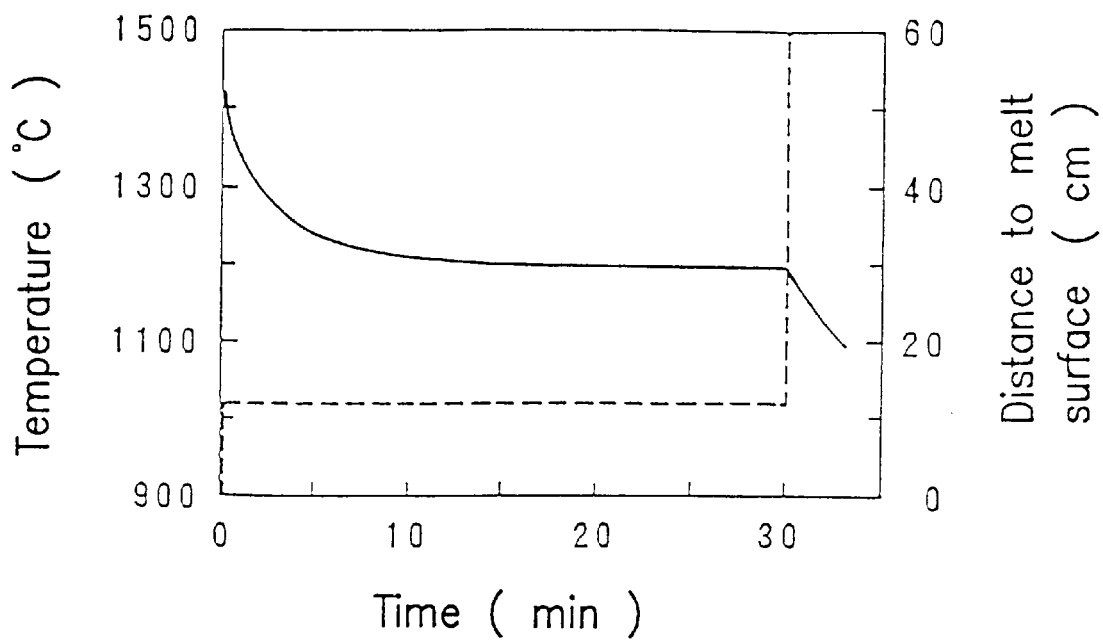
FIG. 5 illustrates the relationship between the temperature variation of the separated surface and its distance from the melt surface according to example I of the invention.
Figure 6:
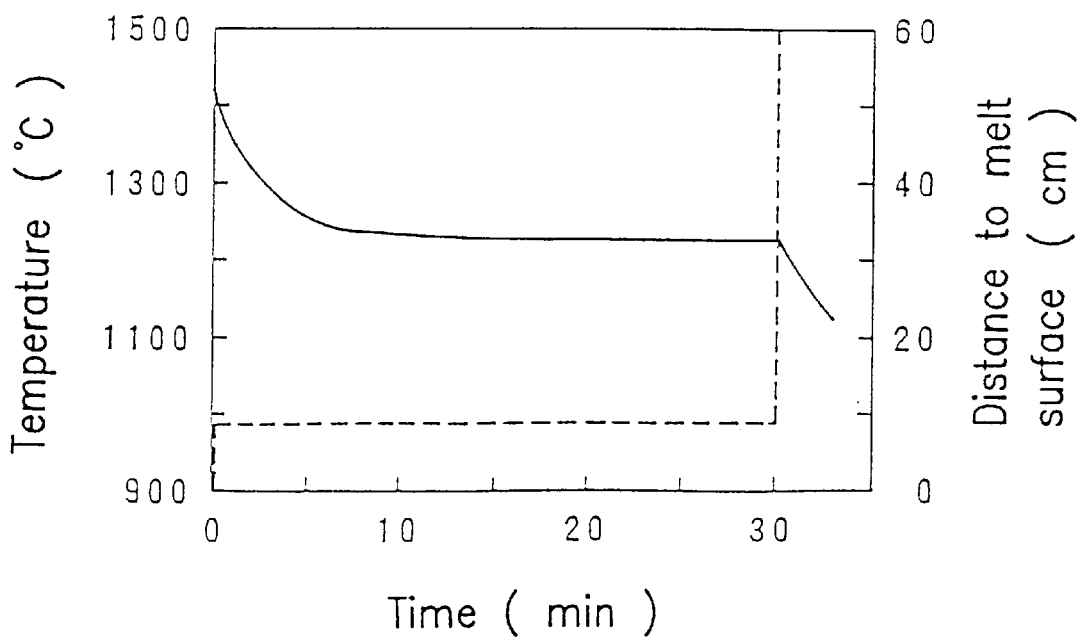
FIG. 6 illustrates the relationship between the temperature variation of the separated surface and its distance from the melt surface according to example J of the invention.
Figure 7:
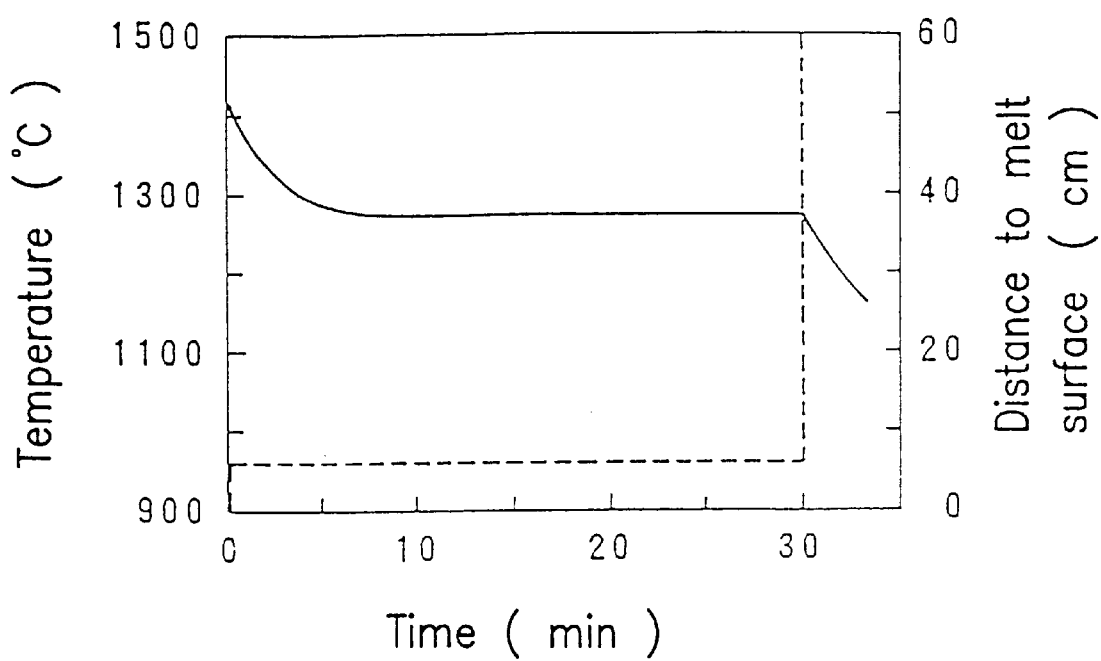
FIG. 7 illustrates the relationship between the temperature variation of the separated surface and its distance from the melt surface according to example K of the invention.

The cooling method of the example H, referring to FIG. 4, lifts the single-crystal rod at a rate of higher than 500 mm/min to where there is a distance of 22 cm from the melt surface. The single-crystal rod is then retained there for 30 minutes for cooling. The single-crystal rods of example I through example K have various distances from the melt surface and are cooled by means of the method utilized in the example H. FIG. 5 through FIG. 7 illustrate the relationships between the temperature variation of the separated surface and the distance from the separated surface to the melt surface in the example I through example K, respectively. Since the single-crystal rods of the example H through example J are retained still for more than 30 minutes when the separated surface has a temperature of 1250° C.–1000° C., no dislocation is introduced in the single-crystal rods.

The cooling method of the example C includes a first cooling step in which the single-crystal rod is fast lifted to where there is a distance of 100 cm from the melt surface when the rod is separated from the melt. Then the rod is cooled rapidly in a range in which the temperature is between 1250° C.–1000° C. The example K raises the single-crystal rod to where there is a distance of 6 cm from the melt surface when it is separated from the melt. The rod is retained there for about 30 minutes and then cooled rapidly in a range in which the temperature is between 1250° C.–1000° C. Therefore, the rods of the example C and example K have dislocations.

In the aforementioned examples, even though no tail step for separating the crystal rod from the melt is carried out when the crystal body is finished, the effects of crystal diameter, dopants, temperature gradient along crystal orientation, lift rate and oxygen concentration can be eliminated by an appropriate cooling method, thereby preventing the introduction of dislocations in the crystal body.

The cycle time of the fabrication of the single-crystal rod has a reduction of 10% if the tail step is omitted. Moreover, the material required to form the tail portion can be utilized to fabricate more crystal body, thereby increasing about 6% of the rod length.

The method of the invention separates the single-crystal rod from the melt when the growth of the crystal body is finished. Since the cooling rate of the separated surface is controlled, no dislocation is introduced in the rod body even though no tail step is carried out. Therefore, the productivity of the single-crystal semiconductor by means of the CZ method is improved.

What is claimed is:

1. A method for fabricating a single-crystal semiconductor rod by means of Czochralski method being characterized in that:

after finishing a Body step for growing a crystal body having a diameter of the specific dimension, the rod is immediately separated from a melt, and the rod is cooled gradually by controlling a lifting rate, thereby forming a concave or concave-convex shape on a separated surface.

2. The method as claimed in claim 1, wherein the rod separated from the melt is cooled within a range from a melt temperature to the room temperature to the room temperature and the rod is cooled gradually in a range of arbitrary crystal temperature, thereby preventing the dislocations extended from the separated surface.

3. The method as claimed in claim 2, wherein the separated rod is cooled at a rate of lower than 35° C./min when the temperature of the separated surface is within a range between the melting point and 1000° C.

4. The method as claimed in claim 2, wherein the separated rod is kept for more than 30 minutes within a range between 1250° C. and 1000° C.

* * * * *